United States Patent
Huang et al.

(10) Patent No.: US 8,829,549 B2
(45) Date of Patent: Sep. 9, 2014

(54) LIGHT EMITTING DIODE AND FLIP-CHIP LIGHT EMITTING DIODE PACKAGE

(71) Applicant: Genesis Photonics Inc., Tainan (TW)

(72) Inventors: Yi-Ru Huang, Tainan (TW); Chih-Ling Wu, Tainan (TW); Yu-Yun Lo, Tainan (TW); Po-Jen Su, Tainan (TW)

(73) Assignee: Genesis Photonics, Inc., Tainan (TW)

( * ) Notice: Subject to any disclaimer, the term of this patent is extended or adjusted under 35 U.S.C. 154(b) by 0 days.

(21) Appl. No.: 13/687,120

(22) Filed: Nov. 28, 2012

(65) Prior Publication Data

US 2013/0146915 A1   Jun. 13, 2013

(30) Foreign Application Priority Data

Dec. 13, 2011   (TW) .............................. 100145899 A (51) Int. Cl.
*H01L 33/00*   (2010.01)
*H01L 33/60*   (2010.01)
*H01L 33/20*   (2010.01)
*H01L 33/44*   (2010.01)
*H01L 33/64*   (2010.01)
*H01L 33/38*   (2010.01)
*H01L 33/62*   (2010.01)
*H01L 33/40*   (2010.01)

(52) U.S. Cl.
CPC ................ *H01L 33/60* (2013.01); *H01L 33/44* (2013.01); *H01L 2224/16* (2013.01); *H01L 33/641* (2013.01); *H01L 33/387* (2013.01); *H01L 33/382* (2013.01); *H01L 33/62* (2013.01); *H01L 33/20* (2013.01); *H01L 33/405* (2013.01)
USPC ............................................... 257/98; 257/99

(58) Field of Classification Search
USPC ....................................................... 257/98, 99
See application file for complete search history.

(56) References Cited

U.S. PATENT DOCUMENTS

| | | | |
|---|---|---|---|
| 7,476,909 B2 * | 1/2009 | Nagai et al. ..................... 257/94 |
| 2005/0017262 A1 * | 1/2005 | Shei et al. ...................... 257/103 |
| 2010/0207154 A1 * | 8/2010 | Song et al. ...................... 257/98 |
| 2012/0001221 A1 * | 1/2012 | Choi ............................... 257/99 |
| 2012/0273749 A1 * | 11/2012 | Hsia et al. ....................... 257/13 |

* cited by examiner

*Primary Examiner* — Phuc Dang
(74) *Attorney, Agent, or Firm* — Rosenberg, Klein & Lee (57) ABSTRACT

A light emitting diode including a first doped layer, a light emitting layer, a second doped layer and a substrate is provided. A plurality of first grooves penetrate through the second doped layer and the light emitting layer. Thus, a partial surface of the first doped layer is exposed. At least one of the plurality of first grooves extends to edges of the second dope layer and the light emitting layer. An insulating layer is disposed over a part of second doped layer and extends to sidewalls of the first grooves. A first contact is set in the first grooves and electrically connected to the first doped layer. A second contact is set on the second doped layer and electrically connected to the second doped layer. By the first grooves, the first contact can be electrically connected to the first doped layer for improving current spreading.

20 Claims, 11 Drawing Sheets

Fig. 14

LIGHT EMITTING DIODE AND FLIP-CHIP LIGHT EMITTING DIODE PACKAGE

BACKGROUND OF THE INVENTION

1. Fields of the Invention

The present invention relates to a light emitting diode (LED), and particularly to a structure of LED and a flip-chip LED package.

2. Descriptions of Related Art

An LED constructed by an III-V semiconductor material is a wide bandgap light emitting device. The wavelength of the light emitted from the wide bandgap light emitting device ranges from infrared to ultraviolet, covering the entire wavelength of the visible light. Along with the fast development of the high brightness of the gallium nitride (GaN) LEDs, the applications of full-color LED displays, white light LED and the LED for traffic signals are put into practice. Therefore, the various applications of LEDs also become more popular.

A fundamental structure of the LED includes an n-type doped semiconductor layer, a p-type doped semiconductor layer, and a light emitting layer disposed in-between. The light emitting efficiency of the LED depends on the internal quantum efficiency of the light emitting layer and the light extraction efficiency of the LED. Thus, the light emitting efficiency of the LED can be improved by increasing the internal quantum efficiency and the light extraction efficiency. A method of increasing the internal quantum efficiency includes improving the epitaxy quality as well as the structural design. The method of increasing the light extraction efficiency includes reducing the energy loss caused by reflection of the light emitted from the light emitting layer inside the LED.

A conventional LED includes a positive electrode and a negative electrode which are set on the same surface. Yet both the positive and negative electrodes will screen out the light emitted from the light emitting layer. Thus, a structure of flip-chip LED package is provided. The positive and negative electrodes are facing an opaque substrate and a reflection layer is used for making the light emit toward the opposite side of the electrodes. Moreover, if a proper surface-mount substrate such as a silicon one is applied to the structure of flip-chip LED package, the better heat dissipation is attained especially under an operating environment with high current. Thus, the light extraction efficiency of the LED is increased and the internal quantum efficiency of the light emitting layer will not be affected by overheating.

However, the above structure of flip-chip LED package still have the problem of the nonuniform distribution of current in the n-type or the p-type doped layer, which leads to the deterioration of the electrical properties and the reduction of the light emitting efficiency of the LED.

Thus, the present invention provides a light emitting diode, which solves the problems of the nonuniform distribution of current and the LED overheating. Thereby, the light emitting efficiency of the LED is improved.

SUMMARY OF THE INVENTION

Therefore, a primary object of the present invention is to provide a LED with high light emitting efficiency, Another object of the present invention is to provide a flip-chip LED package including the light emitting diode electrically connected to a package substrate to increase the light emitting efficiency and improve the heat dissipation.

In order to achieve the above objects, an LED according to an embodiment of the present invention is provided, which includes a substrate, a first doped layer, a light emitting layer, a second doped layer, a plurality of first grooves, an insulating layer, a first contact, and a second contact. The first doped layer is disposed on the substrate; the light emitting layer is disposed on the first doped layer; and the second doped layer is disposed on the light emitting layer. The plurality of first grooves penetrate through the second doped layer and the light emitting layer. Thus, a partial surface of the first doped layer is exposed. One end of at least one of the plurality of first grooves extends to the edges of the second doped layer and the light emitting layer. The insulating layer is disposed over a part of the second doped layer and extends to the sidewalls of the plurality of first grooves. The first contact is set in the plurality of first grooves and electrically connected to the first doped layer. The second contact is set on the second doped layer and electrically connected to the second doped layer. The insulating layer is used for avoiding a short circuit between the first contact and the second doped layer.

According to an embodiment of the present invention, the LED further includes a reflection layer disposed on the second doped layer.

According to an embodiment of the present invention, the area of the reflection layer is at least half of the area of the second doped layer.

According to an embodiment of the present invention, the total area of the plurality of first grooves ranges from 5% to 15% of the area of the first doped layer.

According to an embodiment of the present invention, the plurality of first grooves are linear grooves.

According to an embodiment of the present invention, the plurality of first grooves are curved grooves.

According to an embodiment of the present invention, at least two of the plurality of first grooves are arranged parallel to each other.

According to an embodiment of the present invention, the distance between two ends of each first groove ranges from $0.5L_L$ to $L_L$, where $L_L$ is the length of the longer side of the substrate.

According to an embodiment of the present invention, the width of each first groove ranges from 10 micrometers to 100 micrometers.

According to an embodiment of the present invention, the LED further includes a plurality of second grooves connected to the other end of the plurality of first grooves, respectively. The extended direction of the plurality of second grooves is different from that of the plurality of first grooves.

According to an embodiment of the present invention, the length of each second groove ranges from $L_L/5n$ to $L_L/n$, where $L_L$ is the length of the longer side of the substrate and n is the number of the plurality of first grooves.

According to an embodiment of the present invention, the number of the plurality of second grooves is xn, where x is a positive integer and n is the number of the plurality of first grooves.

According to an embodiment of the present invention, the number of the plurality of second grooves is equal to the number of the plurality of first groove.

According to an embodiment of the present invention, the other end of each first groove extends to the center of the LED.

According to an embodiment of the present invention, the center of each second groove is connected to each first groove.

According to an embodiment of the present invention, the plurality of first grooves and the plurality of second grooves are linear grooves.

According to an embodiment of the present invention, the plurality of first grooves and the plurality of second grooves are connected perpendicularly to each other.

By means of the plurality of first grooves extending to the edges of the second doped layer and the light emitting layer, the current can spread evenly over the first doped layer through the first contact to improve the problem of current crowding and achieve the uniform distribution of current. Moreover, by connecting the plurality of second grooves to the plurality of first grooves, the distribution of current over the first doped layer is improved. In detail, as the extended direction of the plurality of second grooves is different from that of the plurality of first grooves, the current is impeded by the plurality of second grooves and forced to spread laterally in the first doped layer. After crossing the plurality of second grooves, the current spreads longitudinally over the first doped layer uniformly.

Moreover, according to another embodiment of the present invention, a flip-chip LED package further including a package substrate electrically connected to the LED mentioned above is provided. Due to the thermal properties of the package substrate, the light emitting efficiency is increased and the heat dissipation problem is solved as well.

BRIEF DESCRIPTION OF THE DRAWINGS

The structure and the technical of the present invention to achieve the above and other objects can be fully understood by referring to the following detailed description of the preferred embodiments and the accompanying drawings, wherein.

DETAILED DESCRIPTION OF THE PREFERRED EMBODIMENT

Figure 1:
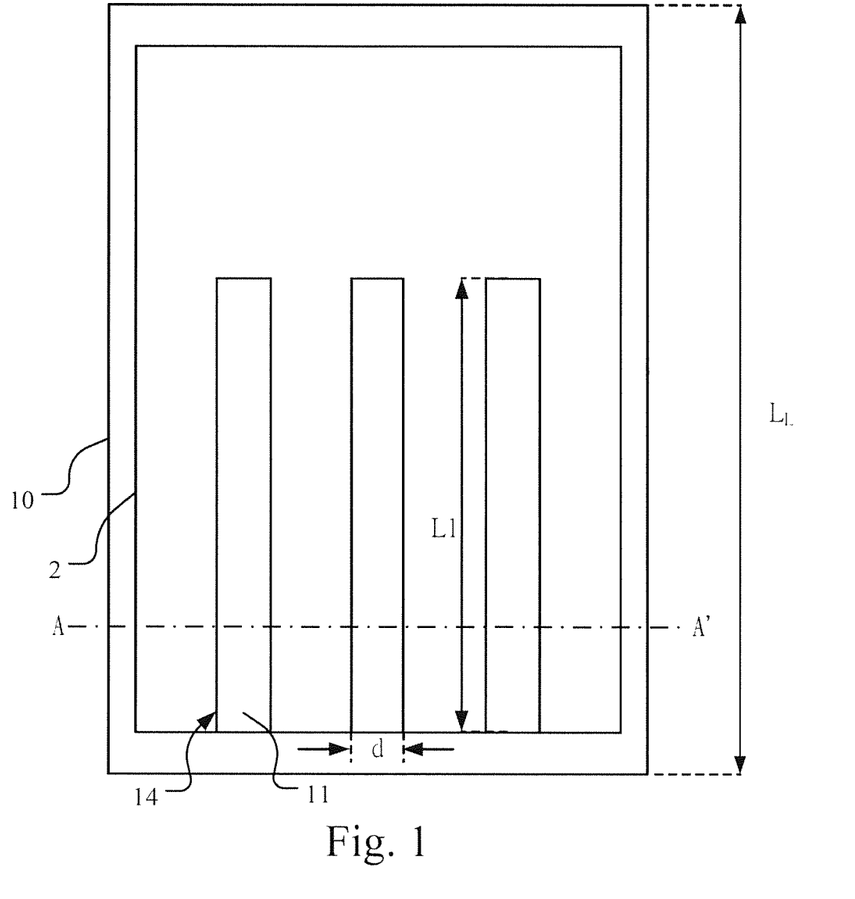
FIG. 1 is a top view of a semiconductor layer and a substrate according to an embodiment of the present invention.
Figure 2:
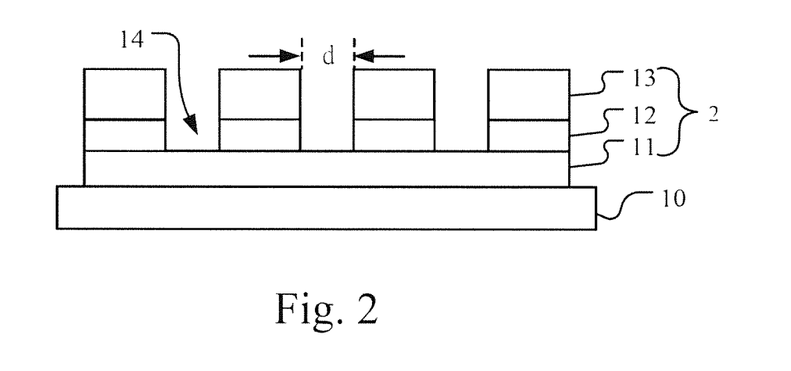
FIG. 2 is a cross-sectional view of the embodiment in FIG. 1 along the line AA'.

Referring to FIG. 1, for simplicity, only a semiconductor layer 2 is revealed. As shown in FIG. 2, the semiconductor layer 2 includes a first doped layer 11, a light emitting layer 12, and a second doped layer 13; an insulation layer, a reflection layer, a first contact, and a second contact are not shown. The semiconductor layer 2 is disposed on a substrate 10. By using a plurality of first grooves 14, a partial surface of the first doped layer 11 is exposed for providing electrical connection with the first contact.

Figure 9:
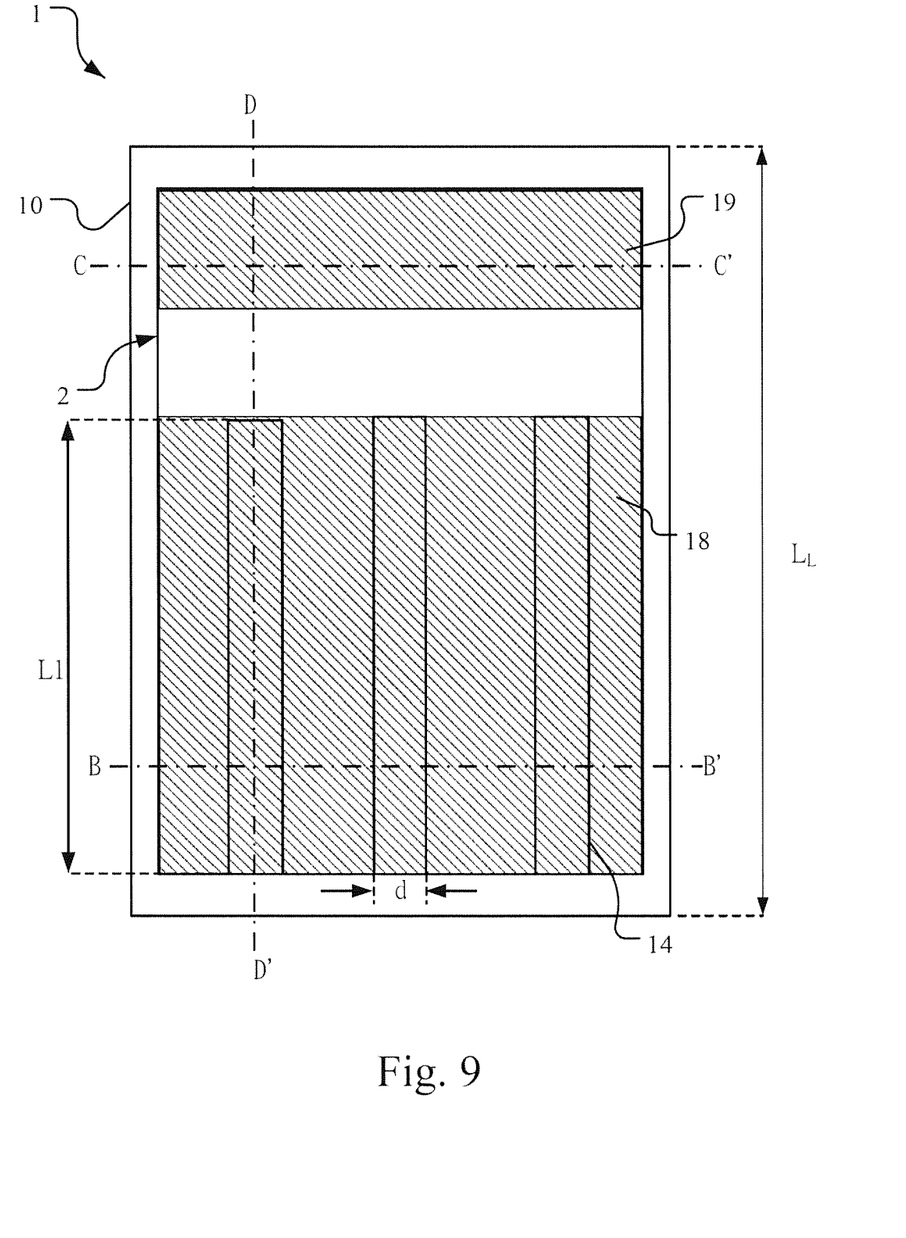
FIG. 9 is a complete top view of the first embodiment according to the present invention.
Figure 10:
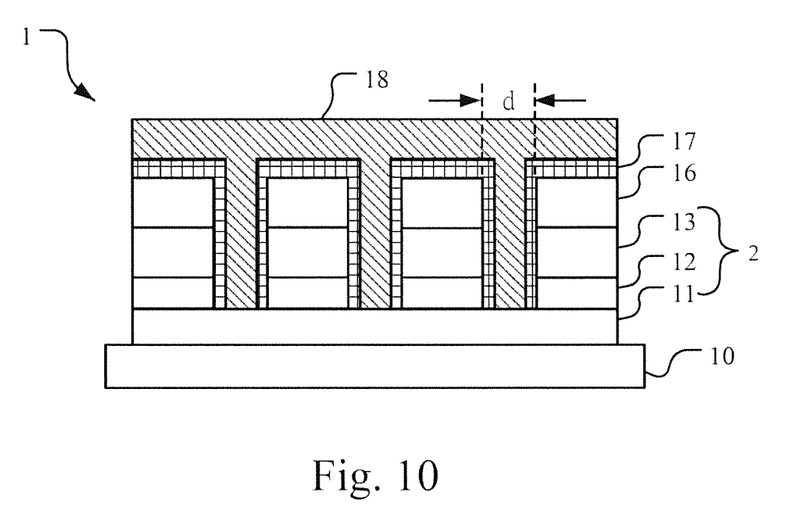
FIG. 10 is a cross-sectional view of the embodiment in FIG. 9 along the line BB'.
Figure 11:
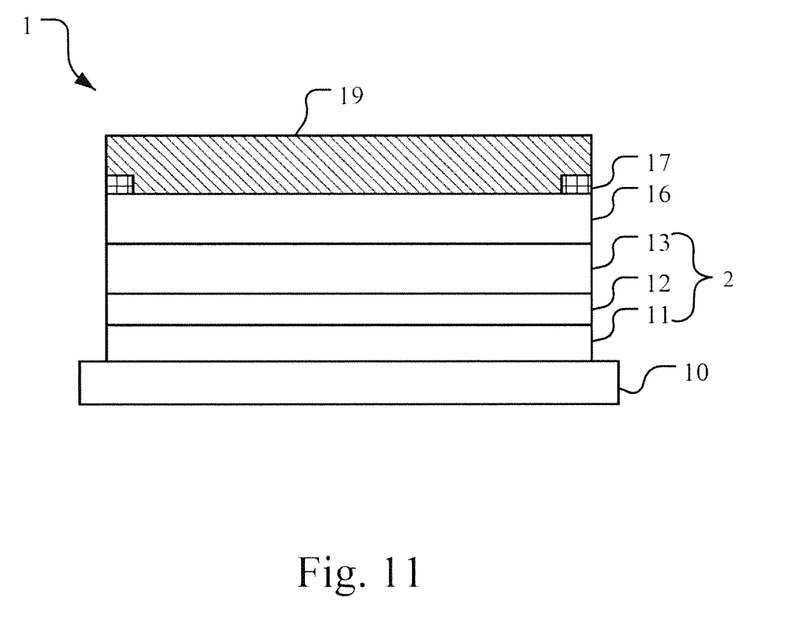
FIG. 11 is a cross-sectional view of the embodiment in FIG. 9 along the line CC'.

Referring to FIG. 2, a first doped layer 11 is disposed on the substrate 10. A light emitting layer 12 is disposed on the first doped layer 11 and a second doped layer 13 is disposed on the light emitting layer 12. In this embodiment of the present invention, a plurality of first grooves 14 penetrate through the second doped layer 13 and the light emitting layer 12. Thus, a partial surface of the first doped layer 11 is exposed and a first contact 18 (as shown in FIG. 9) can be electrically connected to the first doped layer 11 via the plurality of first grooves 14, allowing the uniform distribution of current over the first doped layer 11. Therefore, the distribution of current of the light emitting layer 12 is improved and the illumination uniformity is enhanced. The plurality of first grooves 14 are formed by etching the second doped layer 13 and the light emitting layer 12. For example, the second doped layer 13 and the light emitting layer 12 are etched by using reactive ions after the lithography process. Alternatively, they can also be formed by the selective growth of the second doped layer 13 and the light emitting layer 12.

Figure 3:
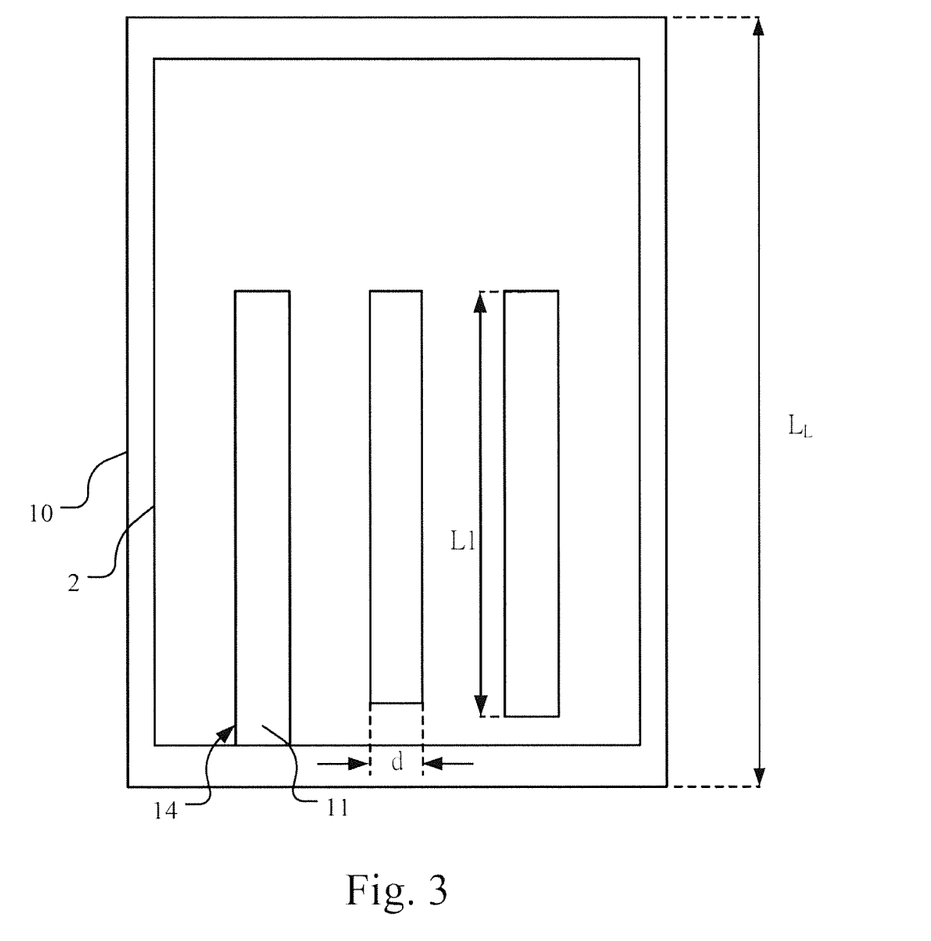
FIG. 3 is a top view of a semiconductor layer and a substrate according to another embodiment of the present invention.
Figure 4:
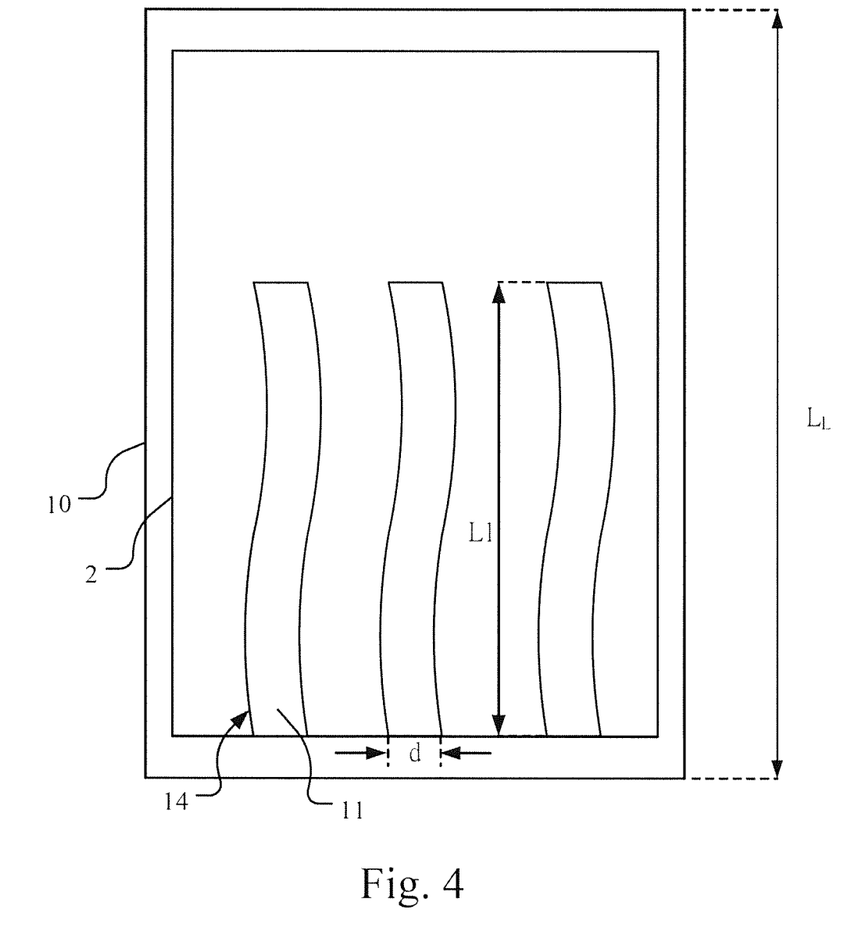
FIG. 4 is a top view of a semiconductor layer and a substrate according to another embodiment of the present invention.
Figure 5:
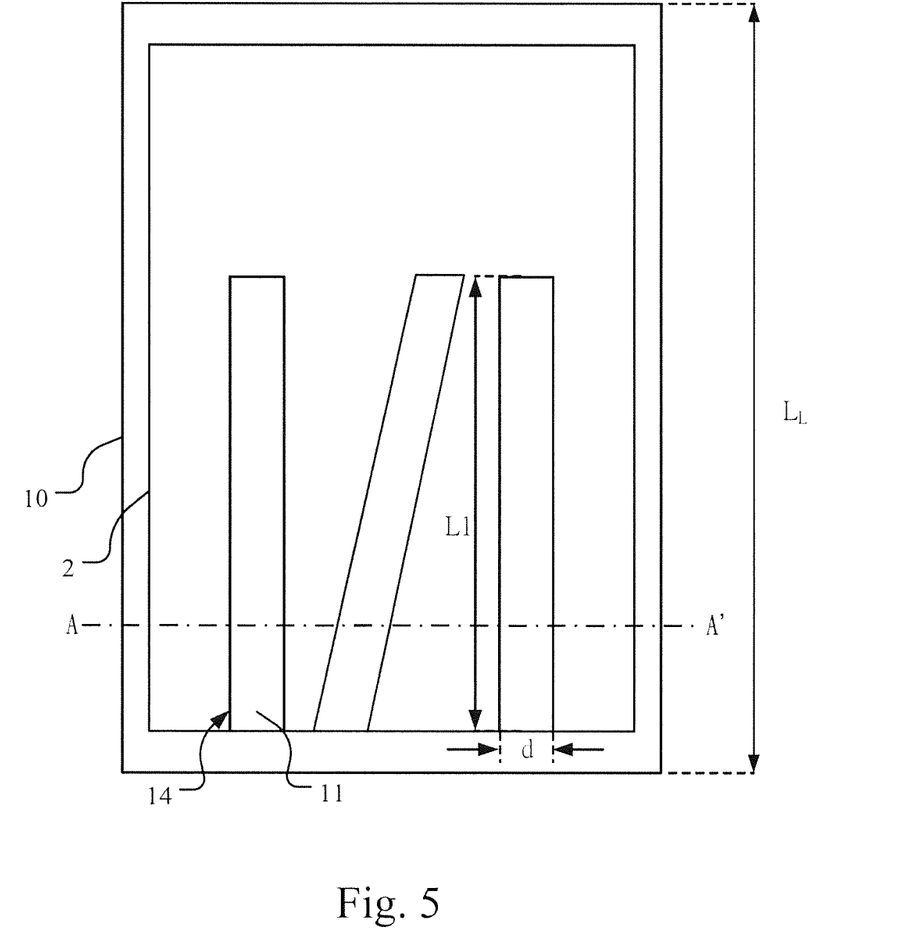
FIG. 5 is a top view of a semiconductor layer and a substrate according to another embodiment of the present invention.

Referring to FIG. 3 to FIG. 5, the different embodiments of the semiconductor layer 2 of the present invention are revealed. In these embodiments, the shape of the first groove 14 is not limited. It can be a linear groove or a curved groove. One end of at least one of the plurality of first grooves 14 extends to the edges of the light emitting layer 12 and the second doped layer 13. Referring to FIG. 1, in a preferred embodiment, one end of each first groove 14 extends to the edge of the semiconductor layer 2. As shown in FIG. 4, each first groove 14 is curved to increase the contact area between the first contact and the first doped layer 11. Thus, the current spreading through the light emitting layer 12 is increased and hence the light emitting efficiency is improved. Moreover, as shown in FIG. 5, for the uniform distribution of current in the first doped layer 11 and effective use of the chip area, preferably, at least two of the plurality of first grooves 14 are arranged parallel to each other. It is preferred that all the first grooves 14 are arranged parallel to each other, as shown in FIG. 1.

For maintaining larger light emitting area and better current spreading in the first doped layer 11 at the same time, the shortest length L1 between two ends of each first groove 14 ranges from $0.5L_L$ to $L_L$, where $L_L$ is the length of the longer side of the substrate 10. Moreover, the problems of the absorption or shield of light occur once the width d of the first groove 14 (as shown in FIG. 1, FIG. 3, FIG. 4, and FIG. 5) is too wide. Yet if the width d of the first groove 14 is too narrow, some other problems such as the low yield rate of the LED occur. Thereby, the width d of each first groove 14 ranges preferably from 10 micrometers to 100 micrometers.

Figure 6:
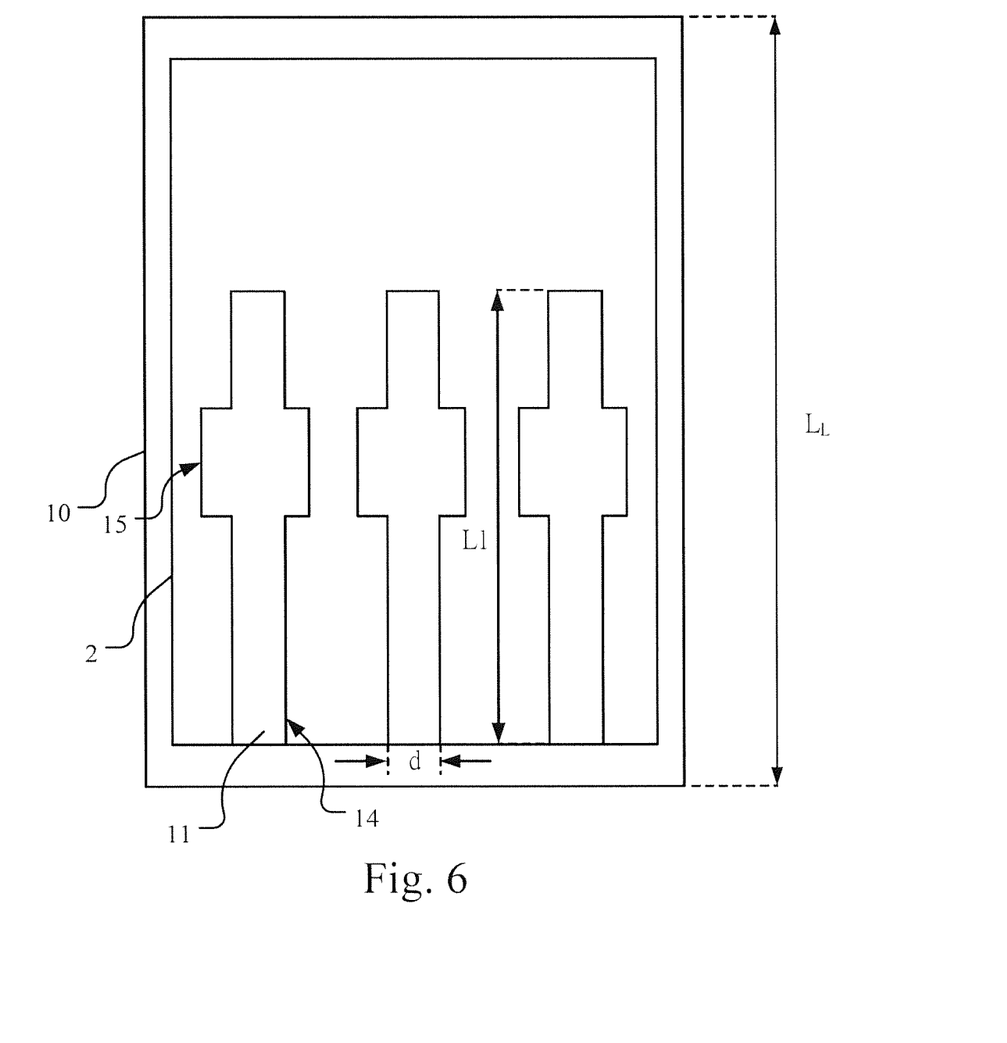
FIG. 6 is a top view of a semiconductor layer and a substrate according to another embodiment of the present invention.
Figure 7:
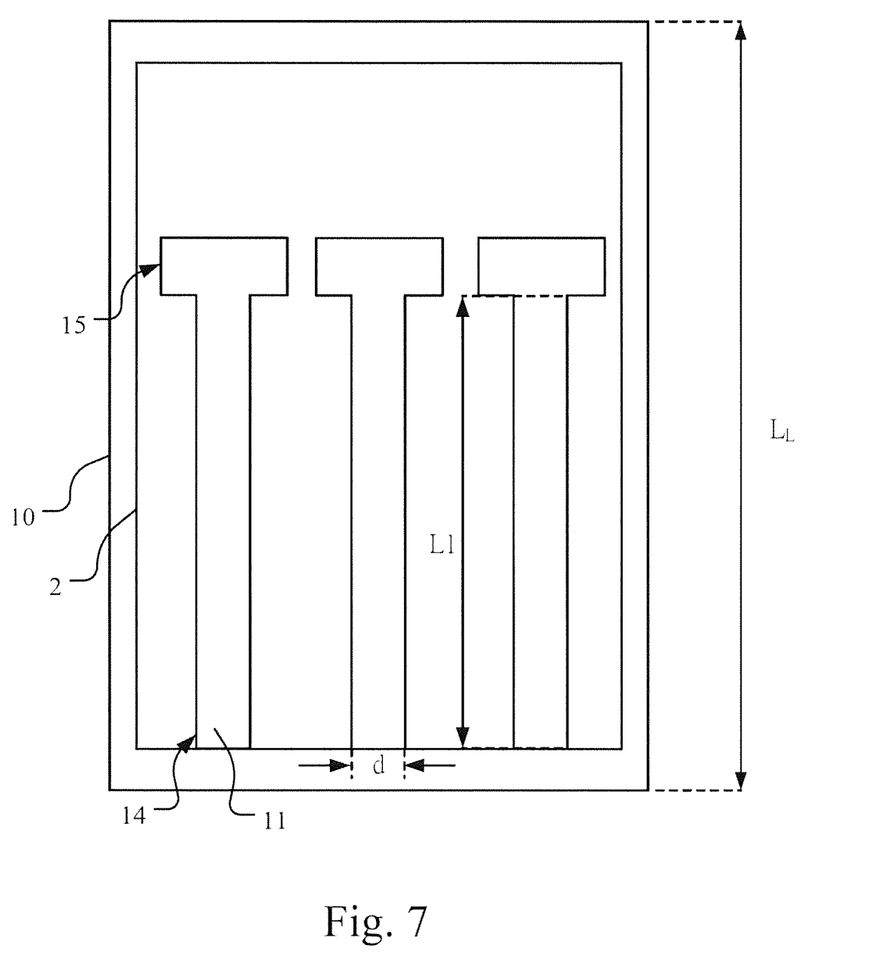
FIG. 7 is a top view of a semiconductor layer and a substrate according to another embodiment of the present invention.
Figure 8:
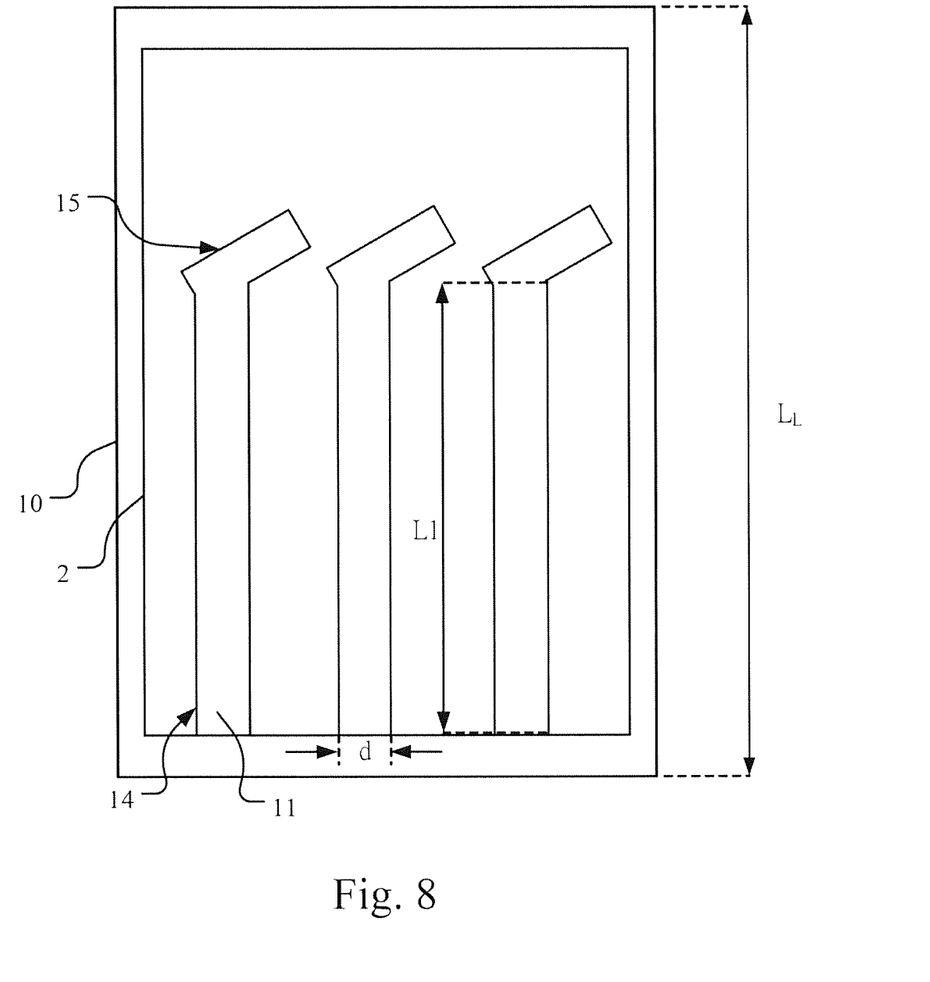
FIG. 8 is a top view of a semiconductor layer and a substrate according to another embodiment of the present invention.

Referring to FIG. 6 to FIG. 8, further embodiments of the semiconductor layer 2 of the present invention are revealed. The difference between these embodiments and the first embodiment in FIG. 1 is that these embodiments further include a plurality of second grooves 15 connected to the plurality first grooves 14, respectively. The extended direction of the plurality of second grooves 15 is different from that of the plurality of first grooves 14. Due to the different extended direction of the plurality of second grooves 15, the lateral distribution of current between the first contact 18 (as shown in FIG. 9) and a second contact 19 (as shown in FIG. 9) is increased.

In order to achieve effective current spreading in the lateral direction, the length of each second groove 15 ranges from $L_L/5n$ to $L_L/n$, where $L_L$ is the length of the longer side of the substrate 10 and n is the number of the plurality of first grooves 14. Although the number of the plurality of second grooves 15 is not limited, the preferred number of the plurality of second grooves 15 is xn for attaining the uniform lateral distribution of current, where x is a positive integer greater than 0 and n is the number of the plurality of first grooves 14. That means that the number of the plurality of second grooves 15 can be larger than that of the plurality of first grooves 14. The number of the second groove 15 is preferably n, so that both the uniform lateral distribution of current and the reduction of light shielding caused by contact are achieved. In other words, the number of the plurality first grooves 14 and that of the plurality of second grooves 15 are equal in these embodiments.

Referring to FIG. 6, the plurality of first grooves 14 and the plurality of second grooves 15 extend in different directions. The plurality of first grooves 14 and second grooves 15 are all linear grooves and connected perpendicularly to each other. The plurality of second grooves 15 are connected to the middle parts of the plurality of first grooves 14 to form cross-shaped grooves. Thus, the exposed area of the first doped layer 11 is increased vertically and horizontally and the chip area is used effectively by the plurality of grooves. Therefore, the vertical and lateral distribution of current in the first doped layer 11 is increased and the light emitting efficiency is improved accordingly.

As shown in FIG. 7 and FIG. 8, for the better lateral distribution of current around the center of the LED 1, each second groove 15 is connected to one end of each first groove 14 that extends to the center of the LED 1. Namely, one end of each first groove 14 extends to the edge of the semiconductor layer 2 while the other end thereof extends to the center of the LED 1 and is connected to the second groove 15. In a preferred embodiment, the first groove 14 is connected to the center of the second groove 15. Moreover, in order to increase the yield rate, both the plurality of first grooves 14 and the plurality of second grooves 15 are linear grooves. Preferably, the plurality of first grooves 14 and the plurality of second grooves 15 are connected perpendicularly to each other, as shown in FIG. 7. Referring to FIG. 9, the plurality of first grooves 14 and the plurality of second grooves 15 are disposed with the first contact 18 for increasing the exposed area on the surface of the first doped layer 11. Thus, the area electrically connected to the first contact 18 is increased for improving the light emitting efficiency.

Referring to FIG. 9 to FIG. 12, a complete top view of an embodiment of the present invention and cross-sectional views along the line BB', line CC' and line DD' of this embodiment are revealed. An LED 1 of the present invention comprises a substrate 10, a first doped layer 11, a light emitting layer 12, a second doped layer 13, an insulation layer 17, a first contact 18, and a second contact 19. Moreover, the LED 1 further comprises a reflection layer 16.

The first doped layer 11 according to the present embodiment is disposed on the substrate 10; the light emitting layer 12 is disposed on the first doped layer 11; the second doped layer 13 is disposed on the light emitting layer 12. In this embodiment, a plurality of first grooves 14 is formed in the LED 1. The plurality of first grooves 14 penetrate through the second doped layer 13 and the light emitting layer 12. Thus, a partial surface of the first doped layer 11 is exposed. Moreover, one end of each first groove 14 further extends to the edges of the second doped layer 13 and the light emitting layer 12. The number of the first grooves 14 is determined according to users' needs. The reflection layer 16 is disposed on the second doped layer 13. The total area of the reflection layer 16 is over half of the total area of the second doped layer 13. The insulation layer 17 is disposed over the reflection layer 16 and extends to the sidewalls of each first groove 14, in other words, to the sidewalls of the light emitting layer 12 and the sidewalls of the second doped layer 13. The first contact 18 of this embodiment is set in the plurality of first grooves 14 for being electrically connected to the first doped layer 11. The second contact 19 is set on the reflection layer 16 and is electrically connected to the second doped layer 13. The area of the first groove 14 ranges from 5% to 15% of the area of the first doped layer 11. The first contact 18 extends to the edge of the semiconductor layer 2 by one end of the first groove part 14 so that the current spreading in the first doped layer 11 is improved.

Figure 12:
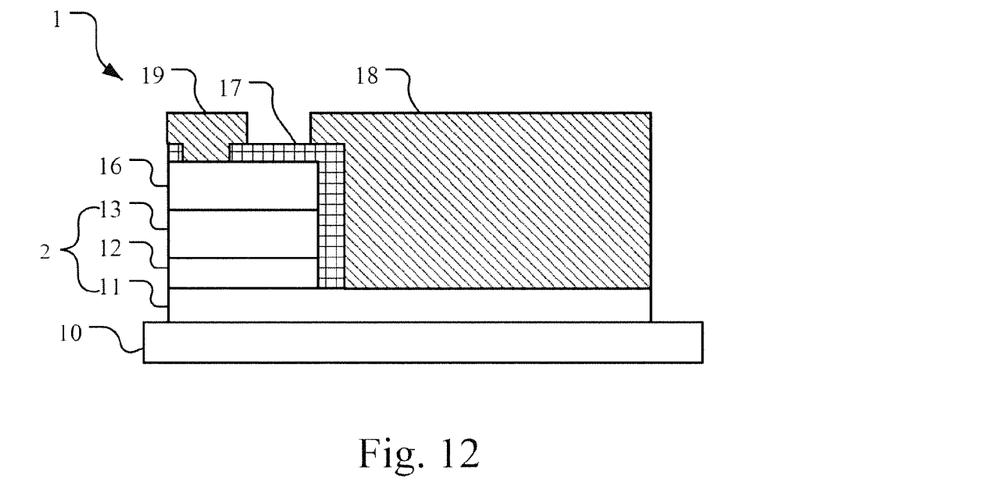
FIG. 12 is a cross-sectional view of the embodiment in FIG. 9 along the line DD'.
Figure 13:
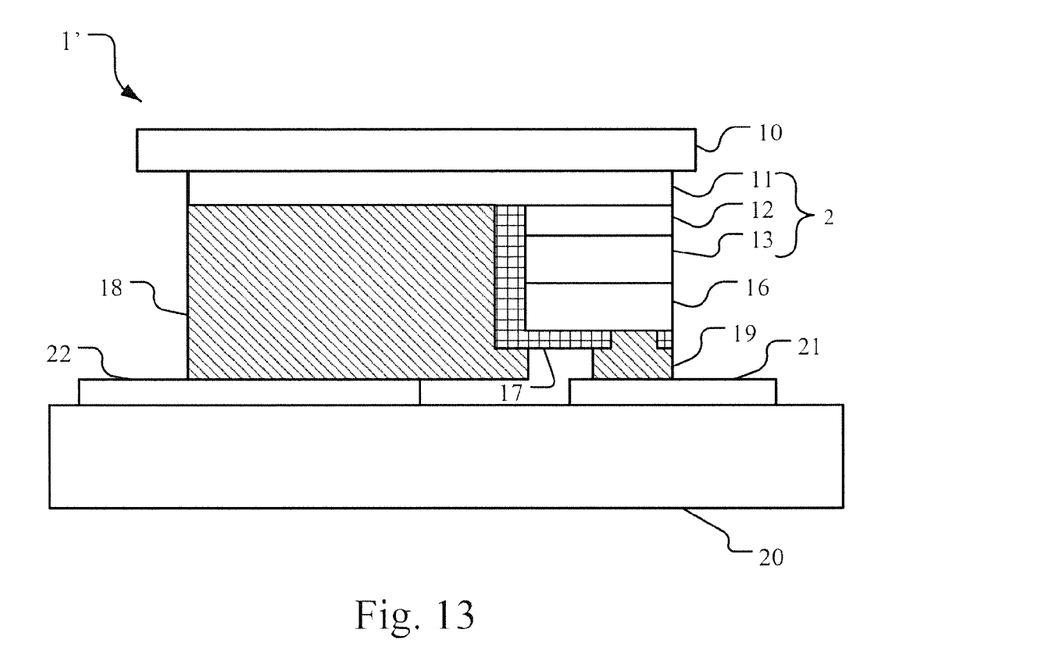
FIG. 13 is a cross-sectional view according to another embodiment of the present invention.
Figure 14:
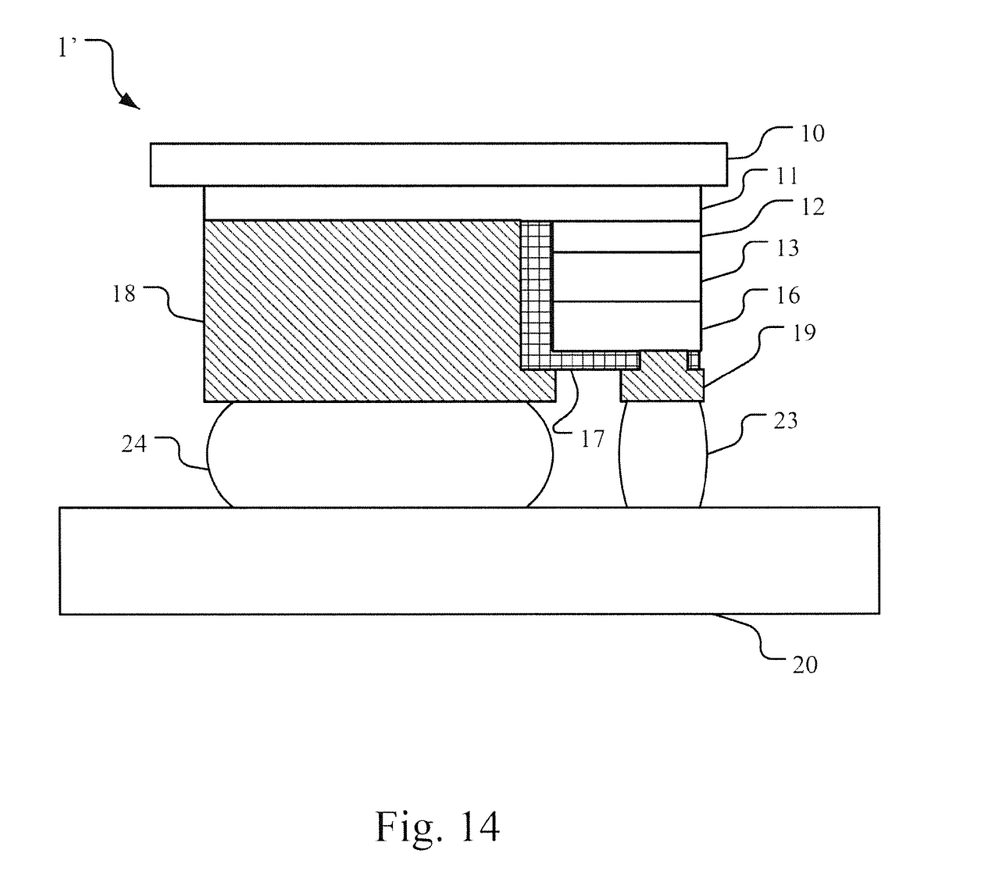
FIG. 14 is a cross-sectional view according to another embodiment of the present invention.

Refer to FIG. 13 and FIG. 14, a cross-sectional view of another embodiment of the present invention is revealed. The LED 1 shown in FIG. 12 is processed by flip-chip packaging to give a flip-chip LED package 1' shown in FIG. 13 and FIG. 14.

As shown in FIG. 13, the LED 1 in FIG. 12 is flipped (upside down) and disposed on a package substrate 20. The first contact 18 and the second contact 19 are electrically connected to the package substrate 20 by eutectic structures 21, 22, respectively. As shown in FIG. 14, the LED 1 in FIG. 12 is also flipped (upside down) and disposed on a package substrate 20 while the first contact 18 and the second contact 19 are electrically connected to the package substrate 20 by bumps 24, 23, respectively. After the LED 1 is flipped on the package substrate 20, the reflection layer 16 is facing the package substrate 20. Thus, the light emitted downwards from the light emitting layer 12 is reflected by the reflection layer 16 and emitted from the substrate 10.

The feature of the present invention, in which a plurality of first grooves 14 extend to the edge of the semiconductor layer 2 can also be applied to a flip-chip LED package. Thus, the present invention further provides a flip-chip LED package 1' for improving the distribution of current as well as solving the problem of heat dissipation.

The substrate 10 is a transparent substrate made from $Al_2O_3$, SiC, GaAs, GaN, AlN, GaP, Si, ZnO, MnO, or glass. The first doped layer 11 and the second doped layer 13 of this embodiment can be an n-type GaN-based semiconductor layer and a p-type GaN-based semiconductor layer respectively. The light emitting layer 12 can be a multiquantum well (MQW) structure. As to the insulation layer 17, it is made from insulating materials with high light transmittivity, including oxide, nitride, or nitrogen oxide. The preferred material of the insulating layer 17 is silicon oxide, silicon nitride, or silicon oxynitride. The reflection layer 16 is made from metal with good reflectivity, including silver, aluminum, titanium, gold, platinum, palladium, or their combinations. The first contact 18 and the second contact 19 are made from electrically conductive materials including conductive metals and non-metal conductive materials. The preferred materials are metals, especially gold, titanium, nickel, aluminum, chromium, platinum or their combinations. The conductive material can be a single layer or a multiple-conductive-layer stack. The package substrate 20 of this embodiment is made from materials with excellent heat dissipation or high heat capacity such as, but not limited to, a silicon substrate, sapphire substrate, ceramic substrate. In considering lattice matching between the LED 1 and the substrate, the sapphire substrate is preferred. The eutectic structures 21, 22 in this embodiment are eutectic metals such as gold-tin alloy, silver-tin alloy, gold-germanium alloys, etc. The bumps 23, 24 are made from metals such as gold, nickel, soldering tin, etc. In addition, the LED 1 can be electrically connected to the package substrate 20. Due to heat transfer property of the package substrate 20, the over-heating problem of the LED 1 is solved.

In summary, the LED of the present invention improves current spearing in the first doped layer by the first groove penetrating through the second doped layer and the light emitting layer and exposing a partial surface of the first doped layer for disposition and electrical connection of the first contact and hence improving the distribution of current in the first doped layer. Moreover, the current spreading in the first doped layer is also improved by the different extended direction of the second grooves. Thus, the overall current distribution in the LED is more uniform. Therefore, the light emitting efficiency of the LED is increased. Furthermore, the LED of the present invention is connected to a package substrate for solving the heat dissipation problem.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light emitting diode, comprising:
a substrate;
a first doped layer, disposed on the substrate;
a light emitting layer, disposed on the first doped layer;
a second doped layer, disposed on the light emitting layer;
a plurality of first grooves, penetrating through the second doped layer and the light emitting layer, and thus a partial surface of the first doped layer is exposed;
an insulating layer, disposed over a part of the second doped layer and extending to the sidewalls of the plurality of first grooves;
a first contact, set in the plurality of first grooves and electrically connected to the first doped layer; and
a second contact, set on the second doped layer and electrically connected to the second doped layer;
wherein from a top view of the light emitting diode, one end of at least one of the plurality of first grooves extends to the edge of the first doped layer.

2. The light emitting diode as claimed in claim 1, wherein the light emitting diode further includes a reflection layer disposed on the second doped layer.

3. The light emitting diode as claimed in claim 2, wherein the area of the reflection layer is at least half of the area of the second doped layer.

4. The light emitting diode as claimed in claim 1, wherein the total area of the plurality of first grooves ranges from 5% to 15% of the area of the first doped layer.

5. The light emitting diode as claimed in claim 1, wherein the plurality of first grooves are linear grooves.

6. The light emitting diode as claimed in claim 1, wherein the plurality of first grooves are curved grooves.

7. The light emitting diode as claimed in claim 1, wherein at least two of the plurality of first grooves are arranged parallel to each other.

8. The light emitting diode as claimed in claim 1, wherein the shortest distance between two ends of each first groove ranges from 0.5 $L_L$ to $L_L$, where $L_L$ is the length of the longer side of the substrate.

9. The light emitting diode as claimed in claim 1, wherein the width of each first groove ranges from 10 micrometers to 100 micrometers.

10. The light emitting diode as claimed in claim 1, wherein the light emitting diode further includes a plurality of second grooves connected to the plurality of first grooves, respectively, and the extended direction of the plurality of second grooves is different from that of the plurality of first grooves.

11. The light emitting diode as claimed in claim 10, wherein the length of each second groove ranges from $L_L/5n$ to $L_L/n$, where $L_L$ is the length of the longer side of the substrate and n is the number of the plurality of first grooves.

12. The light emitting diode as claimed in claim 10, wherein the number of the plurality of second grooves is xn, where x is a positive integer and n is the number of the plurality of first grooves.

13. The light emitting diode as claimed in claim 10, wherein the number of the plurality of first grooves is equal to the number of the plurality of second grooves.

14. The light emitting diode as claimed in claim 10, wherein the other end of each first groove extends to the center of the light emitting diode and is connected to each second groove.

15. The light emitting diode as claimed in claim 10, wherein the center of the plurality of second grooves is connected to the plurality of first grooves, respectively.

16. The light emitting diode as claimed in claim 10, wherein the plurality of first grooves and the plurality of second grooves are all linear grooves.

17. The light emitting diode as claimed in claim 16, wherein the plurality of first grooves and the plurality of second grooves are connected perpendicularly to each other.

18. A flip-chip light emitting diode package, comprising:
a package substrate;
a light emitting diode, flipped on and electrically connected to the package substrate; the light emitting diode comprising:
a substrate;
a first doped layer, disposed on the substrate;
a light emitting layer, disposed on the first doped layer;
a second doped layer, disposed on the light emitting layer;
a plurality of first grooves, penetrating through the second doped layer and the light emitting layer, and thus a partial surface of the first doped layer is exposed;
an insulating layer, disposed over a part of the second doped layer and extending to the sidewalls of the plurality of first grooves;
a first contact, set in the plurality of first grooves and electrically connected to the first doped layer;
a second contact, set on the second doped layer and electrically connected to the second doped layer;
wherein from a top view of the light emitting diode, one end of at least one of the plurality of first grooves extends to the edge of the first doped layer.

19. The flip-chip light emitting diode package as claimed in claim 18, wherein the light emitting diode is electrically connected to the package substrate by bumps.

20. The flip-chip light emitting diode package as claimed in claim 18, wherein the light emitting diode is electrically connected to the package substrate by eutectic structures.

* * * * *